United States Patent [19]

Bray et al.

[11] 3,710,143

[45] Jan. 9, 1973

[54] ELECTRONIC SWITCH

[75] Inventors: Ralph Bray, Philadelphia; Clement W. Rowan, Warminster, both of Pa.

[73] Assignee: Philco-Ford Corporation, Philadelphia, Pa.

[22] Filed: Aug. 6, 1971

[21] Appl. No.: 169,658

[52] U.S. Cl. ..................307/244, 307/253, 307/255, 325/316, 325/492, 328/258, 307/41

[51] Int. Cl. ..............................................H03k 17/00

[58] Field of Search..............307/254, 244, 255, 253; 325/302, 316, 317, 492

[56] References Cited

UNITED STATES PATENTS

| | | | |
|---|---|---|---|
| 3,153,729 | 10/1964 | Leakey | 307/253 |
| 3,543,053 | 11/1970 | Mustain | 307/244 |
| 3,287,644 | 11/1966 | Poppy | 325/316 |

*Primary Examiner*—Herman Karl Saalbach
*Assistant Examiner*—B. P. Davis
*Attorney*—Robert D. Sanborn

[57] ABSTRACT

A circuit for switching the power supply between the FM and AM sections of an AM-FM radio receiver. A single-pole single-throw switch is used in conjunction with a transistor circuit to provide the required single-pole double-throw switching function.

5 Claims, 2 Drawing Figures

PATENTED JAN 9 1973 3,710,143

INVENTORS
RALPH BRAY
CLEMENT W. ROWAN
BY Gail W. Woodward
AGENT

ELECTRONIC SWITCH

BACKGROUND OF THE INVENTION

In a typical AM-FM radio receiver it is customary to arrange the circuits so that sections common to both functions appear only once and are switched to apply them in the appropriate configuration. It is common to construct an AM section comprising an r-f amplifier, converter, i-f amplifier, and detector and a separate FM section comprising a like group of circuits. Each section is usually arranged separately on printed wiring boards or on separate areas on a single board. Previously it was standard practice to employ one set of active devices such as vacuum tubes or transistors and to switch the passive elements in such a way as to use the active devices for both AM and FM functions. This made parts layouts, wiring, and lead dress rather critical, and complicated switching circuits had to be employed. With the development of low-cost high-performance transistors, it became economical to employ two sets of active devices wired in an optimum manner into two separate functional circuits. This greatly simplifies the switching function and leads to improved circuit performance. Furthermore the increasing use of integrated semiconductor microelectronic circuits makes this latter approach even more economical and desirable.

With two separate receiver functions it became standard practice to switch inputs, outputs, and the power supply portions. Thus a three section two position switch could be used to provide the FM-AM switching. However such a switch still is costly and presents reliability problems. Accordingly it was found that the input function switch could be eliminated by using frequency duplexing. That is, the input or antenna circuit was connected to both FM and AM sections with component values selected to pass the FM signals to the FM circuit and the AM signals to the AM circuit. Since the power supply is switched between sections no spurious signals can be developed in the deenergized section and the outputs can be connected in parallel to the audio amplifier section input. This reduces the switch to a simple single-pole double-throw switch thereby simplifying the circuit and increasing reliability.

SUMMARY OF THE INVENTION

It is an object of this invention to switch a radio receiver from AM to FM operation, or vice versa, through the agency of a simple, inexpensive, single-pole single-throw switch.

It is a further object to employ a transistor switching circuit with a single-pole single-throw switch control to switch a power supply between AM and FM sections in a radio receiver.

These and other objects are achieved by means of a transistor switching circuit controlled by a single-pole single-throw switch. When the switch is closed the transistor switch is in a state that applies power to one receiver section. When the switch is open, the transistor switch state is such as to apply the power supply to the other receiver section.

DESCRIPTION OF THE INVENTION

Figure 1:
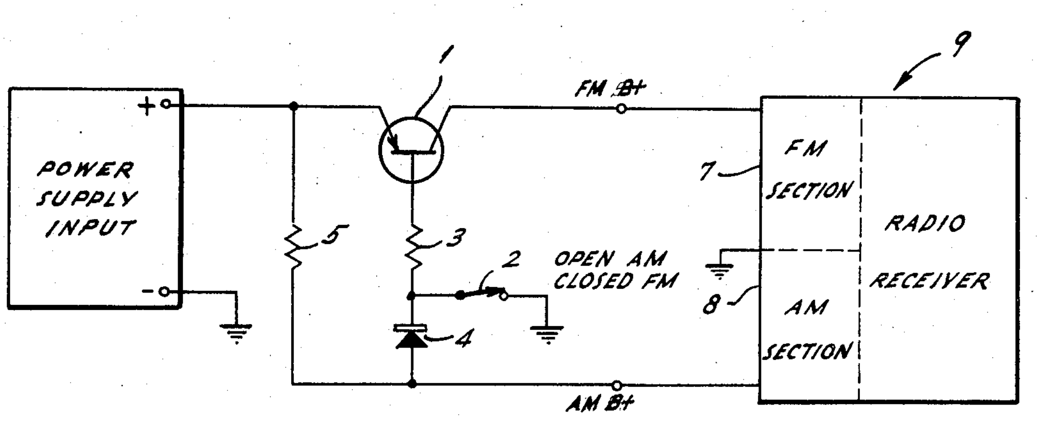
FIG. 1 is one embodiment of the invention.

In FIG. 1, PNP transistor 1 is connected between the positive power supply terminal and the FM receiver section 7 of an AM-FM radio receiver 9. When single-pole single-throw switch 2 is closed, the transistor base is returned to ground through resistor 3 and the closed switch, and the transistor is turned on. Resistor 3 controls the base current and its value is selected to hold the transistor in saturation. Thus the positive power supply terminal is effectively connected to the FM receiver section. With switch 2 closed, current also flows in the series circuit including resistor 5 and germanium diode 4 which is forward biased by virtue of the positive voltage source. Since diode 4 is forward biased, it will develop about 0.3 volt at the AM B+ line. This is insufficient voltage to permit the AM circuits to operate.

When switch 2 is open, diode 4 becomes back biased thereby reducing the base current of transistor 1 to almost zero, thus turning it off and removing B+ from the FM receiver section. Current is supplied to the AM receiver section 8 through resistor 5. The value of resistor 5 is chosen to produce a reasonably small voltage drop when supplying current for AM receiver operation.

Figure 2:
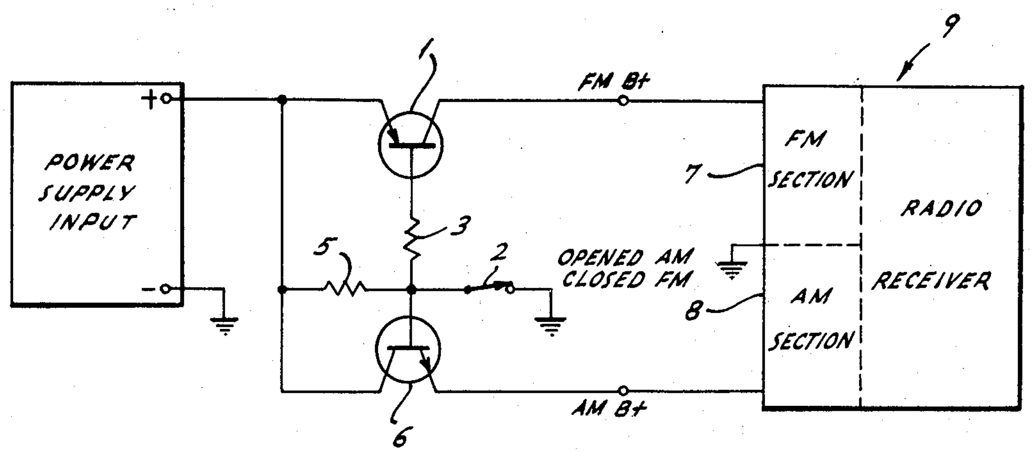
FIG. 2 is a second embodiment of the invention.

In FIG. 2 a modified circuit is shown. PNP transistor 1 is connected between FM receiver section 7 and the positive power supply terminal, and NPN transistor 6 is connected between AM receiver section 8 and the positive power supply terminal. The bases of transistors 1 and 6 are connected together through biasing resistor 3, the positive power supply terminal is connected via biasing resistor 5 to the junction of the base of transistor 6 and resistor 3, and said junction is connected to ground through AM-FM switch 2. When switch 2 is closed, transistor 6 is turned off and transistor 1 is turned on with resistor 3 controlling base current to produce saturation. For this condition current flows only in the FM receiver section 7.

When switch 2 is open, transistor 6 is turned on by virtue of base current flowing through resistor 5 which has a value selected to hold transistor 6 in saturation. For this condition transistor 1 is cut off, and current flows only in the AM receiver section 8.

In the circuits shown the switching function is accomplished with only a simple single-pole single-throw switch, the contact resistance of which may be as high as several hundred ohms while still providing suitable switching action. The switch itself passes a current substantially lower than that being switched. Thus a simple, high reliability switching action is obtained with a very small addition of active elements and associated parts. The result is a substantial improvement in receiver reliability and operating life.

The following list shows a set of component values that have produced satisfactory operation:

Transistor 1 - 2N 5354 PNP silicon
Resistor 3 - 820 ohms
Diode 4 - 1N 60 germanium
Resistor 5 - 330 ohms
Transistor 6 - 2N 2711 NPN silicon While the circuits shown have been related to FM-AM receiver circuit switching, they could be used for any switching condition where a supply is to be switched between a pair of loads. It is intended that the scope of the invention be limited only by the following claims.

We claim:

1. A switching circuit for controlling the flow of current between a source and one of two loads in response to the condition of a single-pole single-throw switch, said circuit comprising:

a. transistor means connected between said source and one of said two loads for applying current thereto when biased to the conductive state, b. resistor means connected between said source and the other of said two loads for applying current thereto when said transistor is biased to the non-conductive state, and c. means including said single-pole single-throw switch and a semiconductor diode, for biasing said transistor conductive or nonconductive in response to the condition of said switch.

2. The circuit of claim 1 wherein said two loads comprise the AM and FM sections of a radio broadcast receiver, and said switch comprises the receiver FM-AM function switch.

3. A switching circuit for selectively controlling the supply of electric power between a power source having two terminals and one of two loads in response to the opening and closing of a single-pole single-throw switch, each of said two loads having two terminals, one of which is connected in common with one of said two power source terminals, said circuit comprising:

a. a transistor having its emitter-collector circuit connected between the other terminal of said source and the other terminal of one of said loads for supplying current to said one load when said transistor is biased to the conductive state, b. means including said switch and a bias resistor, connected between the base of said transistor and said common terminal of said loads for selectively placing said transistor in either its conductive or non conductive state, and c. circuit means, including a second bias resistor, an associated semiconductor diode, and said switch, connected between said other terminal of said source and the other terminal of the other of said loads for supplying current to the other of said loads when said transistor is biased to its non-conductive state.

4. A switching circuit for controlling the flow of current between a source and one of two loads in response to the condition of a single-pole single-throw switch, said circuit comprising:

a. a first transistor connected between said source and one of said two loads for applying current thereto when biased to the conductive state;

b. means including said single-pole single-throw switch and a first bias resistor for biasing said first transistor conductive or non-conductive in response to the condition of said switch, c. a second transistor, of a type complementary to said first transistor, connected between said source and the other of said two loads, and d. circuit means including a second bias resistor and said switch for rendering said second transistor conductive when said transistor is non-conductive to apply current to the other of said two loads.

5. A switching circuit for selectively controlling the supply of electric power between a power source having two terminals and one of two loads in response to the opening and closing of a single-pole single-throw switch, each of said two loads having two terminals, one of which is connected in common with one of said two power source terminals, said circuit comprising:

a. a transistor having its emitter-collector circuit connected between the other terminal of said source and the other terminal of one of said loads for supplying current to said one load when said transistor is biased to the conductive state, b. means, including said switch and a bias resistor connected between the base of said transistor and said common terminal of said loads for selectively placing said transistor in either its conductive or non-conductive state, and c. circuit means, including a second bias resistor and a second transistor, having a conductivity type complementary to said transistor, and said switch, connected between said other terminal of said source and the other terminal of the other of said loads for supplying current to the other of said loads when said transistor is biased to its non-conductive state.

* * * * *